United States Patent [19]
Murata

[11] Patent Number: 4,791,337
[45] Date of Patent: Dec. 13, 1988

[54] LIGHTING METHOD FOR VACUUM FLUORESCENT DISPLAY WITH REDUCED FLICKERING

[75] Inventor: Hajime Murata, Shimada, Japan

[73] Assignee: Yazaki Corporation, Japan

[21] Appl. No.: 860,920

[22] Filed: May 8, 1986

[30] Foreign Application Priority Data

May 9, 1985 [JP] Japan .................. 60-096581

[51] Int. Cl.$^4$ .................. H05B 37/00; H05B 39/00
[52] U.S. Cl. .................. 315/169.1; 315/168; 315/174; 340/791
[58] Field of Search .................. 315/169.3, 168, 169.1, 315/169.2, 169.4, 169, 170, 174; 340/781, 789, 713, 805, 752, 766, 791

[56] References Cited

U.S. PATENT DOCUMENTS

| | | | |
|---|---|---|---|
| 3,343,030 | 9/1967 | Dragon et al. | 340/805 |
| 3,659,149 | 4/1972 | Fleming | 315/169.3 |
| 4,158,794 | 6/1979 | Sandler | 315/169.1 |
| 4,204,209 | 5/1980 | Suehiro | 315/169.1 |
| 4,234,821 | 11/1980 | Kako et al. | 315/169.3 |
| 4,459,514 | 7/1984 | Morimoto et al. | 315/169.1 |
| 4,622,549 | 11/1986 | Criscimanga et al. | 340/805 |

Primary Examiner—David K. Moore
Assistant Examiner—Mark R. Powell
Attorney, Agent, or Firm—Wigman & Cohen

[57] ABSTRACT

A lighting method for vacuum fluorescent display which is lighted dynamically with frequency $f_1$ includes applying a time-varying voltage with approximate frequency of $(n+\frac{1}{2})f_1$ to the cathode of the vacuum fluorescent display, where n is a predetermined natural number.

By the method described, flickering in the display is suppressed even when, in the dynamical lighting of the vacuum fluorescent display, the cathode of the vacuum fluorescent display is heated with a time-varying voltage and the lighting duty ratio is reduced.

4 Claims, 4 Drawing Sheets

F1 a G1 b c G2 d e G3 f g G4 F2

LIGHTING METHOD FOR VACUUM FLUORESCENT DISPLAY WITH REDUCED FLICKERING

BACKGROUND OF THE INVENTION

1. Field of the Invention

The present invention relates to a method of lighting the vacuum fluorescent display, in particular to a method of lighting the vacuum fluorescent display that takes measures to overcome the flickering phenomenon that may appear in the tube due to dynamic lighting.

2. Description of Prior Art

The vacuum fluorescent display is now widely used in various fields, for example it is utilized as an instrument and indicator for the motor vehicle.

In this use, the method of so called dynamic lighting method is usually employed to adjust the luminosity of the vacuum fluorescent display, wherein a pulsed voltage with the duty ratio corresponding to the desired luminosity and with a predetermined high repetition frequency is applied to the anode electrode and/or the grid of the display; consequently the display is turned on and off with a high repetition frequency, which is indiscernible by human vision and the display appears as a light source having the desired luminosity without flickering.

However, if the cathode filament of the display is heated by the AC current, the beat caused by the difference between the repetition frequency pulsed voltage and the frequency of the AC current may have a low frequency that is disadvantageously discernible by human vision.

Accordingly, due to a drawback in the conventional method of dynamic lighting, the vacuum fluorescent display flickers, bothering the watcher of the display.

SUMMARY OF THE INVENTION

An object of the present invention, which is aimed at resolving the problems mentioned above, is to provide a lighting method for a vacuum fluorescent display which is capable of suppressing the flickering of the displayed luminance even when, in the dynamic lighting of the vacuum fluorescent display, the cathode of the vacuum fluorescent display is heated with a time-varying voltage and the lighting duty ratio is reduced.

Another object of the present invention is to provide a lighting method of the vacuum fluorescent display which is capable of suppressing the flickering of the display, even when the phase of the time-varying voltage that is supplied to the cathode does not correspond to the phase of the flashing timing of the dynamic lighting, in the case of dynamic lighting of the vacuum fluorescent display in which the cathode of the vacuum fluorescent display is heated by the time-varying current.

Another object of the present invention is to provide, when the vacuum fluorescent display is dynamically lighted by heating its cathodes with a time-varying voltage, a lighting method of the vacuum fluorescent display which is free from flickering in the displayed luminance, even when use is made of a relatively low frequency time-varying voltage that has no radio wave fault as the required time-varying voltage.

Another object of the present invention is to provide a method of driving the cathodes of the vacuum fluorescent display which makes it possible to display the vacuum fluorescent display that has multiple digits with approximately uniform brightness without flickering.

Another object of the present invention is to provide a dynamic lighting method of the vacuum fluorescent display which has an easy luminance control by means of the adjustment of the duty ratio of the lighting.

In order to achieve the above objects, the present invention is arranged to have a time-varying voltage with an approximate frequency of $(n+\frac{1}{2})f_1$ applied to the cathodes of the vacuum fluorescent display, where $f_1$ is the repetition frequency of display lighting and n is a predetermined natural number.

DETAILED DESCRIPTION OF A PREFERRED EMBODIMENT

Figure 1A:
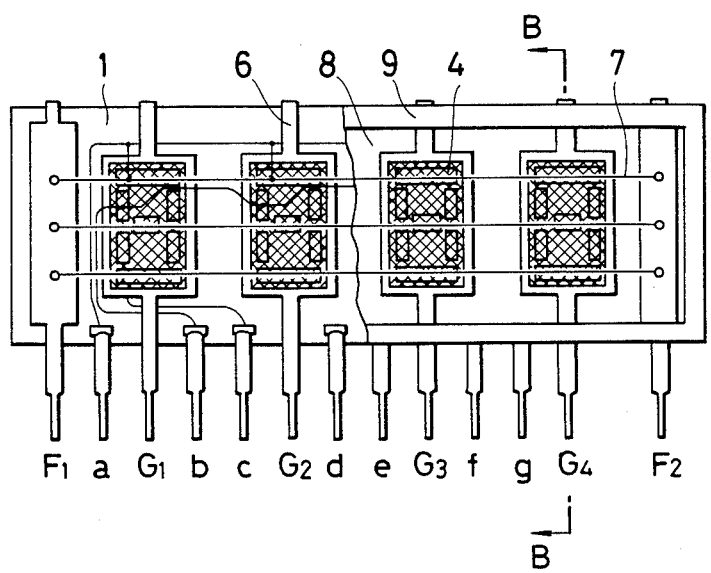
FIGS. 1 (A) and 1 (B) are front elevational and side sectional views, respectively, illustrating the vacuum fluorescent display in accordance with the present invention.

A vacuum fluorescent display of dynamic lighting type that is used, for example, as an annunciator for motor vehicle has a general configuration as shown in FIGS. 1 (A) and 1 (B). FIG. 1 (A) is its front view, and FIG. 1 (B) shows the cross-section view taken along line B-B of FIG. 1 (A).

Figure 1B:
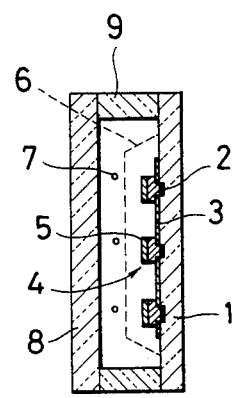

In FIG. 1B, on a base glass 1 there are formed wirings 2, insulation coatings 3, anode electrodes 4 with the form of "8", and phosphors 5, each laminated in appropriate order by means of thick film printing. On top of the phosphor 5 there is a grid 6 with predetermined spacing. A plurality of cathode filaments 7 are provided above the grids 6 with predetermined distance apart from the grids 6, with the ends of the filaments 7 being fixed to the filament terminals $F_1$ and $F_2$ that are provided on both ends of the vacuum fluorescent display. Each of these elements are loaded in a vacuum container that is sealed hermethcally by the base glass 1, front glass 8, and side glass 9.

In such a configuration, if the device is heated to a temperature above about 600° C. by passing current in the cathode filaments 7, there will be emitted thermal electrons from the cathode filaments 7. Then, if an anode voltage of 10V to 50V is applied to the node electrodes 4 that correspond to desired alphanumeric characters, and at the same time, a grid voltage which is nearly.equal to the anode voltage is applied to the desired digit grids 6, electrons that are emitted from the cathode filaments 7 are accelerated by the grid and anode voltages, collide with the phosphors 5 on the anode electrodes 4 to cause the phosphors to emit light by exciting them.

In this way, it is possible to display desired alphanumeric characters on the desired digits. In this case, the displayed luminance depends upon the relative voltages of the anode electrode 4 and the grid electrode 6 with respect to the cathode filaments 7. Therefore, when the cathode filaments are heated with an AC current, it is necessary to apply an AC voltage with a frequency such that the luminance variations due to the potential variations of the cathode filaments 7 will not be perceived as flickerings.

Figure 2:
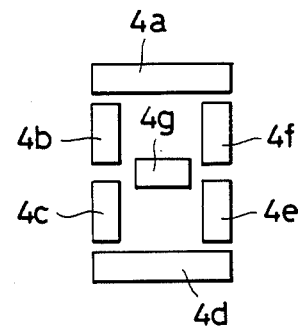
FIG. 2 is a front view that shows an embodiment of disposition of the anode electrodes in FIG. 1.

Next, the mechanism of dynamic lighting will be described. FIG. 2 illustrates the disposition of the anode electrode 4 that is common to all of the digits in FIG. 1 (A). An anode electrode 4 consists of seven anode segments $4a$ to $4g$ that are arranged in the form of the character "8". The way in which each of the segments $4a$ to $4g$ is wired is the same for all digits, and each of the segments is- connected respectively to the anode terminals a to g in FIG. 1 (A). In addition, $G_1$ to $G_4$ in FIG. 1 (A) are the grid terminals for the respective digits.

Figure 3:
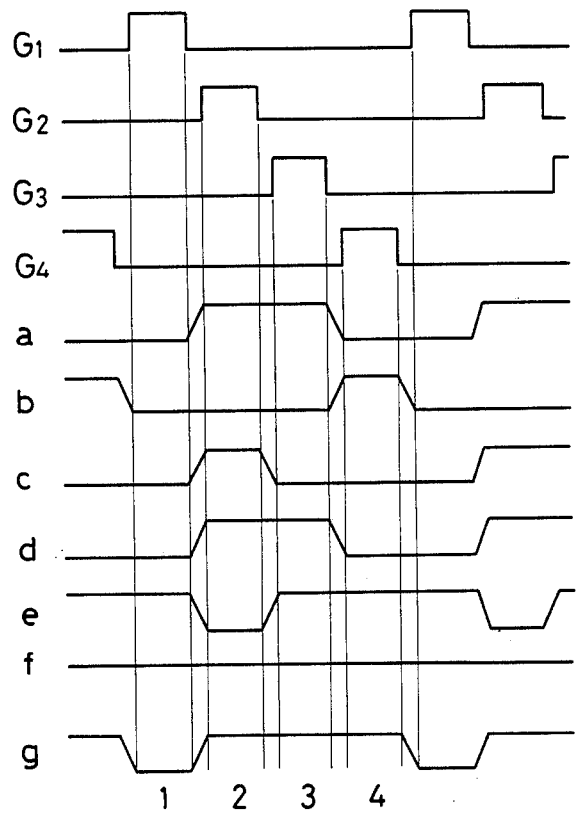
FIG. 3 is a diagram for illustrating the waveforms of the voltages that are applied to the grid electrodes and the anode electrodes in a prior lighting method.

In a vacuum fluorescent display connected in the above manner, voltages are applied respectively to the grid terminals $G_1$ to $G_4$ and the anode terminals a to g as shown in FIG. 3. Pulsed voltages are applied successively to the grid terminals $G_1$ to $G_4$ in such a way as to have a duration while there is no application of voltage to each of the grid terminals. This period is referred to as a blanking time, which is the timing during which every one of the digits will be in the turned-off state in order to prevent abnormal lighting due to leakage. Further, the time ratios of the pulses are sometimes varied to adjust the brightness of the display. It should be noted that the same effects will be obtained by providing. the blanking times for the voltages that are applied to the anode terminals a to g.

On the other hand, when a pulsed voltage applied to the grid terminals $G_1$ to $G_4$ that correspond to the digits desired to be lighted, voltages are applied to the anode segments $4a$ to $4g$ that correpond to the alphanumeric characters that are desired to be lighted.

In the above configuration, the vacuum fluorescent display emits light only when voltages are applied simultaneously to both of the anode electrodes 4 and the grid electrodes 6. Thus, when a voltage is applied, for example, only to the grid terminal $G_1$, the digits that correspond to each of the grid terminals $G_2$, $G_3$, and $G_4$ will be in the turned-off state regardless of the voltages that are applied to the anode terminals a to g, and only the phosphor 5 for the anode segments $4a$ to $4g$ that correspond to the anode terminals a to g of the digit that corresponds to the grid terminal $G_1$ is lighted. An analogous situation will take place when a voltage is applied to either one of the grid terminals $G_2$, $G_3$, and $G_4$.

As in the above, the operation of applying voltages simultaneously to the grid terminals that correspond to the digits that are desired to be lighted and to the anode terminals that correspond to the anode electrodes that are desired to be lighted, is carried out successively for each digit. By repeating this operation with a frequency which does not cause one to perceive flickerings (above about 50 Hz), it becomes possible to have a display in which the characters for all digits appear as if they are lighted uniformly. It is to be noted that in the timing chart shown in FIG. 3 the digits are designated by the numerals "1, 2, 3, and 4."

Heretofore, in the configuration as in the above, the frequency of the AC voltage applied for heating the cathode filaments 7 has been set at a value which is independent from the repetition frequency of the pulsed voltages that are applied to the grid terminals $G_1$ to $G_4$ and the anode terminals a to g. Because of this, the frequency of the voltage applied to the cathode filaments 7 and the repetition frequency for display, tended to generate beats, leading to flickerings in the display.

In the prior method, the wave number ratio of both frequencies is chosen to be sufficiently large so as not to have variations in the displayed luminance, even when there are generated beats.

However, in the case where the duty ratio of the pulse has to be changed substantially in order to adjust the displayed luminance, in response to the changes in ambient brrghtness, as in the case of a display for a motor vehicle, if the pulse duty ratio is reduced, then the displayed luminance is varied again sharply due to the beats, leading again to the problem of having flickerings on the display screen.

Figure 4:
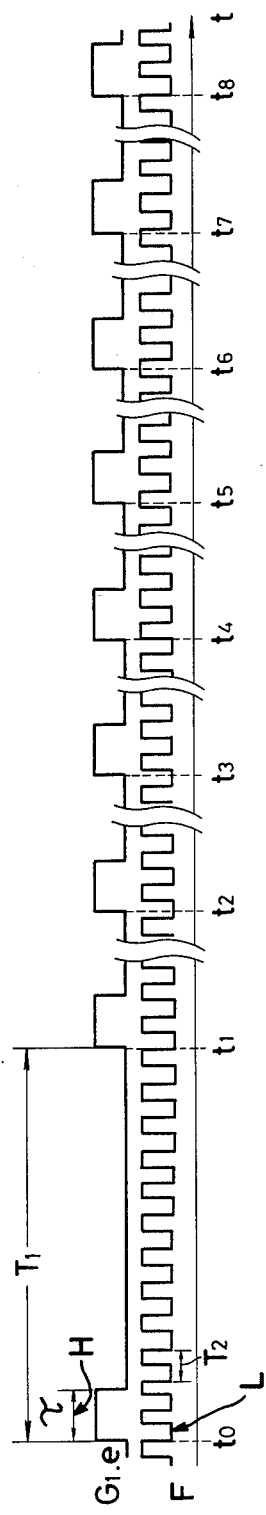
FIG. 4 is a diagram for illustrating the timing of the voltages that are applied to the grid terminal $G_1$, the anode terminal e, and the cathode filaments F in the prior lighting method.
Figure 5:
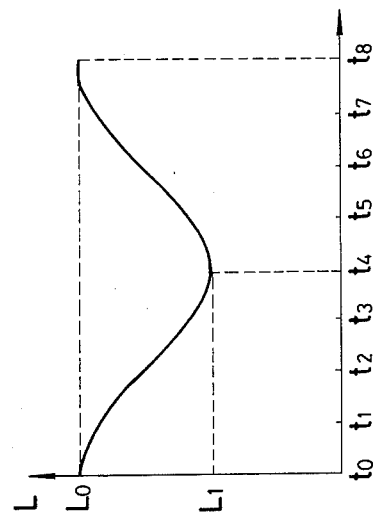
FIG. 5 is an explanatory diagram for illustrating the beats in the displayed luminance of the vacuum fluorescent display for the case when voltages are applied to the grid terminal, the anode terminal, and the cathode filaments, with the timing as shown in FIG. 4.

FIGS. 4 and 5 are explanatory diagrams for illustrating the beats and the variations in the luminance. In FIG. 4, $G_1.e$ represents the timing in which, for example, both of the grid terminal $G_1$ and the anode terminal e are at high potential, and F represents the AC voltage that is applied to the cathode filaments. Here, it is assumed that $G_1.e$ varies with a repetition period $T_1$, with the holding time $\tau$ of H level during each period (therefore, the duty ratio is $\tau/T_1$). Further, it is assumed that the AC voltage F that is applied to the cathode filaments 7 has a period $T_2$, and that it has the same phase as the $G_1.e$ signal at the time $t=t_0$.

Moreover, the phosphor 5 emits light only when both of the grid terminal $G_1$ and the anode terminal e are at high potential and the cathode filaments 7 are at low potential. Accordingly, actual display takes place when the $G_1.e$ signal is on H level and the F signal is on L level in the figure. For instance, when the $G_1.e$ signal is on H level during the time from $t=t_0$ to $t=t_0+\tau$, the F signal will be on L level during the time from $t=t_0$ to $t=t_2/2$, and $t=t_0+T_2$ to $t=t_0+3T_2/2$, so that the phosphor 5 glows with the luminance $L_0$ which corresponds to the duration of time $T_2$ for which the actual display takes place.

Now, the $G_1.e$ signal and the F signal vary, with the period $T_1$ for the former and with the period $T_2$ for the latter that is independent of the period $T_1$. Therefore, the brightness of the phophor that glows in accordance with the levels of both signals generate beats that are related to the periods $T_1$ and $T_2$.

FIG. 5 illustrates one period of the beat. Namely, the luminance L of the phosphor 5 which is at $L=L_0$ for the time $t=t_0$ decreases gradually for $t=t_1, t_2, t_3, t_4$ with the elapse of time, due to the shift in the relative phase between the variations in $G_1.e$ and the variations in F. At the time $t=t_4$, the period during which F is on L level while $G_1.e$ is on H level becomes $T_2/2$, so that the luminance reaches a minimum $L_1$. Thereafter, the luminance increases gradually for $t=t_5, t_6, t_7, t_8$ with the elapse of time to returns to its original value $L_0$.

The period of the beats for the example shown in FIG. 4 is $8T_1$ which reaches, for example, even to 0.16 sec (6.25 Hz) for $T_1=0.02$ sec (50 Hz).

Furthermore, in contrast to the acceleration of the thermal electrons that contribute to the glowing, over the duration of $T_2$ in the time from $t=t_0$ to $t=t_0+\tau$, the acceleration will last only for the duration of $T_2/2$ during the time from $t=t_4$ to $t=t_4+\tau$, so that maximum variation of luminance L in the above process is approximately $\Delta L=2L_1$.

Consequently, the variations in the luminance become discernible by human vision.

It should be noted that if the frequency of the AC voltage to be applied to the cathode filaments is further increased, it becomes possible to prevent the flickerings since the ratio of the variation in the luminance, $L=(L_0-L_1)$, to the mean luminance, $(L_0+L_1)/2$, becomes much less than unity. However, it gives rise to a possibility of generating radio wave faults due to flow of a high frequency current.

Figure 6:
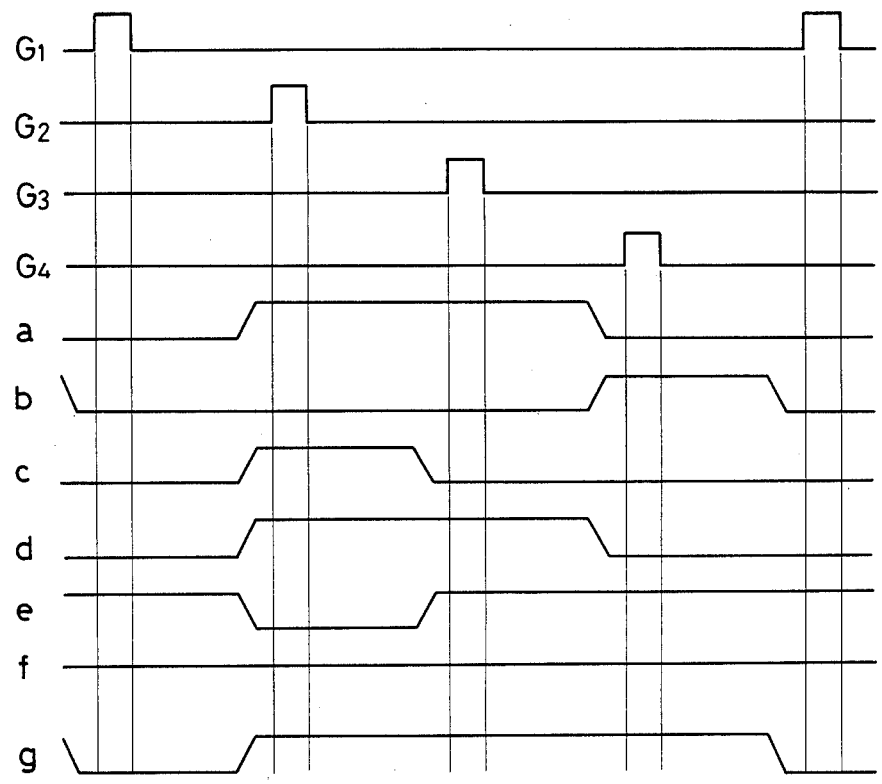
FIG. 6 is a timing chart that shows the waveforms of the voltages that are applied to the gride electrodes and the anode electrodes in the embodiment of the lighting method in accordance with the present invention.

In the following, an embodiment of the present invention will be described. In FIG. 6 are shown the voltage waveforms at each terminals when the numerals "1,, 2, 3, and 4" are displayed analogous to FIG. 3 by the lighting method due to the present invention by the use of the vacuum fluorescent display as shown in FIG. 1. Further, in FIG. 7 are shown the timing $G_1.e$ in which both of the grid terminal $G_1$ and the anode segment $4e$ are at high potential, and the waveform F of the voltage that is applied to the filaments 7.

Figure 7:
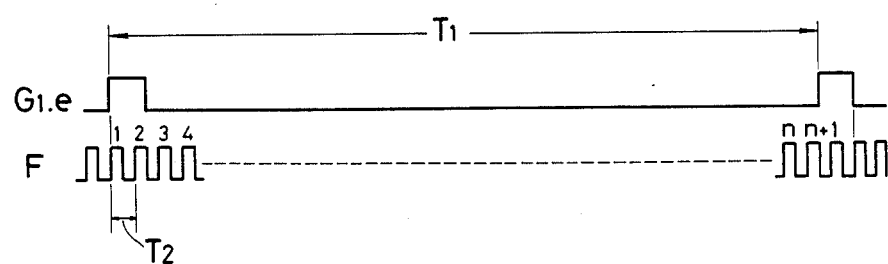
FIG. 7 is a diagram for illustrating the waveforms of the voltages that are applied to a grid electrode and the filaments in the embodiment of the lighting method in accordance with the present invention.

As shown in FIG. 7, the timing in which both the grid terminal $G_1$ and the segment $4e$ are at high potential has a fixed repetition period $T_1$ of lighting. The period $T_1$ is set, for instance, at about 0.01 sec. On the other hand, the voltage that is applied to the cathode filaments 7 of the vacuum fluorescent display has a period given by $T_2=T_1/(n+\frac{1}{2})$. Here, n is a predetermined natural number which may be chosen, for instance, to be about 400.

By setting both frequencies as in the above, the potential distribution for the cathode filaments 7 at an arbitrary lighting time at which $G_1.e$ is on H level, is displaced in phase corresponding to $T_2/2$ with respect to the potential distribution for the cathode filaments 7 for the lighting time at which $G_1.e$ becomes H level for the next time.

As mentioned earlier, the displayed luminance depends upon the relative voltages of the anode electrode and the grid electrode with reference to the cathode filament. According to the lighting method of the present invention, the voltages of the anode electrode and the grid electrode with reference to the cathode filament are averaged over the time of $2T_1$. Therefore, by setting $2T_1$ to a value for which flickerings are not recognizable (for example, less than 0.02 sec) it becomes possible to prevent flickerings in the display.

Consequently, according to the present invention, it becomes possible to make it utterly impossible to recognize flickerings in the display, even by setting the duty ratio of lighting to an extremely small value.

It is to be noted that, for the period $T_1$ of repeated lighting, the period $T_2$ of the time-varying voltage that is applied to the cathode filaments is set at $T_2=T_1/(n+\frac{1}{2})$ (n is a natural number). However, it is not at all necessary to stick to this value. The reason for this is as follows. Namely, when the period for which both the grid terminal $G_1$ and the segment $4e$ are at high potential is $T_1$, and the period of the time-varying voltage $T_2$ that is applied to the cathode filaments 7 is about $T_1/n$, the luminance of the vacuum fluorescent display varies with a beat period of $T=|1/T_2-n/T_1|$. The period T corresponds to a frequency of $f=|f_2-nf_1|$.

Therefore, the frequency $f_2$ may be set at any value in the range $f_1/2>|f_2-nf_1|>f_c$. Here, $f_c$ is the critical fusion frequency (CFF) for which the flickerings in the luminance is no longer recognizable. In this manner, it becomes possible to prevent flickering in the display, similar to the embodiment described in the above.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A method for preventing a flickering phenomena in a vacuum fluorescent display tube lighted dynamically and used as a display for a motor vehicle, comprising adjusting a ratio between a frequency $f_1$ of a first time-varying voltage applied to at least one of an anode and a grid of the tube and a frequency $f_2$ of a second time-varying voltage applied to a cathode of the tube so that a beat frequency of the $f_1$ and $f_2$ frequencies is produced and becomes larger than a critical fusion frequency for a human eye, wherein $f_1$ is set at a frequency sufficiently smaller than frequencies which will cause radio wave faults in devices disposed around the display for the motor vehicle, and $f_2$ is adjusted approximately equal to $(n+\frac{1}{2})f_1$, where n is a predetermined natural number.

2. The method for preventing the flickering phenomena as claimed in claim 1, in which the frequency of the time-varying voltage to be applied to said cathode is such that the potential of the anode of the vacuum fluorescent display becomes positive with respect to its cathode for a number of times during the period in which the vacuum fluorescent display lights up once.

3. The method for preventing the flickering phenomena as claimed in claim 1, in which the time-varying voltage that is to be applied to heat said cathode has a pulse shaped waveform.

4. The method of claim 1 wherein $f_1$ is about 100 hertz.

* * * * *